(12) United States Patent
Lee et al.

(10) Patent No.: US 7,646,639 B2
(45) Date of Patent: Jan. 12, 2010

(54) CIRCUIT AND METHOD GENERATING PROGRAM VOLTAGE FOR NON-VOLATILE MEMORY DEVICE

(75) Inventors: Jin-wook Lee, Seocho-gu (KR); Jin-Yub Lee, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 11/844,514

(22) Filed: Aug. 24, 2007

(65) Prior Publication Data
US 2008/0084749 A1      Apr. 10, 2008

(30) Foreign Application Priority Data
Oct. 10, 2006    (KR) .................. 10-2006-0098643

(51) Int. Cl.
*G11C 16/04*    (2006.01)
(52) U.S. Cl. .................. 365/185.08; 365/185.03; 365/185.24
(58) Field of Classification Search ............ 365/185.18, 365/185.03, 185.24
See application file for complete search history.

(56) References Cited

U.S. PATENT DOCUMENTS 6,426,892 B2 *    7/2002    Shibata et al. ......... 365/185.03
7,245,528 B2 *    7/2007    Shibata et al. ......... 365/185.03

FOREIGN PATENT DOCUMENTS

| JP | 11031391 | 2/1999 |
| JP | 11134879 | 5/1999 |
| KR | 1019970051388 A | 7/1997 |
| KR | 1020040008532 A | 1/2004 |

* cited by examiner

*Primary Examiner*—Gene N. Auduong
(74) *Attorney, Agent, or Firm*—Volentine & Whitt, PLLC

(57) ABSTRACT

Provided are a circuit and method for generating a program voltage, and a non-volatile memory device using the same. The circuit, which generates a program voltage for programming a memory cell of a semiconductor memory device, includes a program voltage controller and a voltage generating unit. The program voltage controller generates a program voltage control signal according to program/erase operations information. The voltage controller generates a program voltage in response to the program voltage control signal.

15 Claims, 4 Drawing Sheets

CIRCUIT AND METHOD GENERATING PROGRAM VOLTAGE FOR NON-VOLATILE MEMORY DEVICE

CROSS-REFERENCE TO RELATED PATENT APPLICATIONS

This application claims the priority of Korean Patent Application No. 10-2006-0098643, filed on Oct. 10, 2006, the subject matter of which is hereby incorporated by reference.

BACKGROUND OF THE INVENTION

1. Field of the Invention

The present invention relates to a non-volatile memory device. More particularly, the invention relates to a non-volatile memory device capable of generating a program voltage in accordance with a number of program/erase operations applied to memory cells in the device.

2. Description of the Related Art

An electrically erasable/programmable non-volatile memory device is capable of retaining data even when supply of power is discontinued. A flash memory is a representative example of electrically erasable/programmable non-volatile memory device.

In particular, a NAND-type flash memory has a string construction in which a plurality of flash memory cells are connected in series, and thus can easily be integrated and may be fabricated at low cost. For this reason, the NAND-type flash memory has been used as data memory for various types of portable products.

A memory cell within a flash memory is programmed or erased using a physical phenomenon known as F-N tunneling. Certain general principals associated with the programming or erasing of a memory cell in a flash memory will now be described.

During an erasing operation, a ground voltage is applied to the control gate of a memory cell transistor, and a high voltage (i.e., a voltage greater than a nominally supply voltage) is applied to the semiconductor substrate (or bulk) associated with the memory cell. Under these erasure bias conditions, a strong electric field is formed between a floating gate and the bulk. Due to the large difference between voltages apparent at the floating gate and bulk, electrons accumulated on the floating gate are discharged to the bulk by F-N tunneling. In other words, a threshold voltage for the erased cell transistor is moved in a negative direction.

During a programming operation for the memory cell, a high voltage (i.e., a voltage greater than the supply voltage) is applied to the control gate of the constituent cell transistor, and a ground voltage is applied to the drain of the cell transistor and the bulk. Under these bias conditions, electrons are injected onto the floating gate of the cell transistor by F-N tunneling. In other words, a threshold voltage for the programmed cell transistor is moved in a positive direction.

FIG. 1 is a block diagram of a NAND-type flash memory device 100 presented as an example of a non-volatile memory device. The NAND-type flash memory device 100 generally includes a memory cell array 110, a row decoder 130, and a page buffer circuit 150.

The memory cell array 110 is divided into a plurality of memory blocks (not shown), each including a plurality of strings 110_1 through 110_M that extend in a row direction. FIG. 1 illustrates only one memory block for convenience of explanation.

Each of the strings 110_1 through 110_M includes a string selecting transistor SST, a ground selecting transistor GST, and a plurality of memory cell transistors MCT<0> through MCT<N−1> connected in series between the string selecting transistor SST and the ground selecting transistor GST.

The gate of the string selecting transistor SST is connected to a string selection line SSL, and the drain of the string selecting transistor SST is connected to a corresponding bit line BLe or BLo. The gate of the ground selecting transistor GST is connected to a ground selection line GSL, and the source is connected to a common source line CSL. The control gate of each of the memory cell transistors MCT<0> through MCT<N−1> is connected to a corresponding word line of word lines WL<0> through WL<N−1>.

Here, the voltage applied to each of the lines SSL, WL<0> through WL<N>, and GSL is controlled by the row decoder 130 in response to a predetermined timing control signal (not shown), and the voltage apparent on each pair of adjacent bit lines BLe and BLo is controlled by a page buffer (not shown) in the page buffer circuit 150.

A conventional method well know to those skilled in the art may be used to control the lines SSL, WL0 through WLn, and GSL and the pairs of the bit lines BLe and BLo. Hence, a more detailed description will be omitted for the sake of brevity.

In general, an incremental step pulse programming (ISPP) method is used to program respective cell transistors. In the ISPP method, a memory cell is repeatedly programmed while gradually increasing the program voltage, thereby precisely controlling a distribution of threshold voltages for the memory cell.

FIG. 2 is an exemplary timing diagram for a program voltage VPGM applied to a non-volatile memory device within the operation of a conventional ISPP method. As illustrated in FIG. 2, the program voltage VPGM is gradually increased by a step voltage VSTEP, starting from a starting voltage VSTART.

The more programming and/or erasing operations are repeatedly performed in a non-volatile memory device, the shorter the program time required for programming. The program time is shortened mainly due to a well understood charge trapping effect. "Charge trapping" refers to a phenomenon in which some of electrons injected onto a floating gate are captured during programming operations by the oxide layer that exists between the floating gate and a bulk. Thus, the more program/erase operations are performed, the greater the charge trapping effects become.

More particularly, charge trapping effects are associated with the cell transistor on a non-volatile memory cell. As the quantity of trapped charge apparent in the oxide layer increases, fewer electrons must be injected to program the cell transistor. As a result, programming time is reduced.

This effect notwithstanding, a like programming voltage (see, FIG. 2) is applied to cell transistors of a non-volatile memory, regardless of programming time variations associated with charge trapping effects. As a result, the program stress caused by application of the program voltage to the cell transistor is unnecessarily increased. As is well understood by those skilled in the art, over-programming results from program stress. Over-programming results in an undesired migration of threshold voltage for the cell transistor, and prevents data stored in the cell transistor from being accurately read.

Also, when program/erase operations are repeatedly performed in relation to one cell transistor of a non-volatile memory device, charge trapping may occur in all cell transistors associated with the non-volatile memory device, thereby lowering the reliability of the device. Accordingly, there is a need to develop a programming method providing improved reliability for non-volatile memory devices even when program/erase operations are repeatedly performed.

SUMMARY OF THE INVENTION

Embodiments of the present invention provide a circuit adapted for use in a non-volatile memory device capable of generating a program voltage in accordance with program/erase operations information for the non-volatile memory device. Embodiments of the invention also provide a method for differently generating a program voltage according to the program/erase operations information, and a method of programming a non-volatile memory device using same.

In one embodiment, the invention provides a circuit generating a program voltage in a non-volatile memory device, the circuit comprising; a program voltage controller generating a program voltage control signal in accordance with program/erase operations information for the non-volatile memory device, and a voltage generating unit generating the program voltage in response to the program voltage control signal.

In another embodiment, the invention provides a non-volatile semiconductor memory device comprising; a circuit generating a program voltage in a non-volatile memory device, wherein the circuit comprises; a program voltage controller generating a program voltage control signal in accordance with program/erase operations information for the non-volatile memory device, and a voltage generating unit generating the program voltage in response to the program voltage control signal.

In another embodiment the invention provides a method of generating a program voltage for programming a memory cell in a non-volatile memory device, the method comprising; generating a program voltage control signal in accordance with program/erase operations information, and generating the program voltage in response to the program voltage control signal.

In another embodiment the invention provides a programming method for a non-volatile memory device, comprising; generating a program voltage control signal in accordance with program/erase operations information, generating a program voltage in response to the program voltage control signal, and applying the program voltage to a memory cell in the non-volatile memory device.

BRIEF DESCRIPTION OF THE DRAWINGS

Embodiments of the invention will be described with reference to the attached drawings in which.

DESCRIPTION OF EMBODIMENTS

Figure 1:
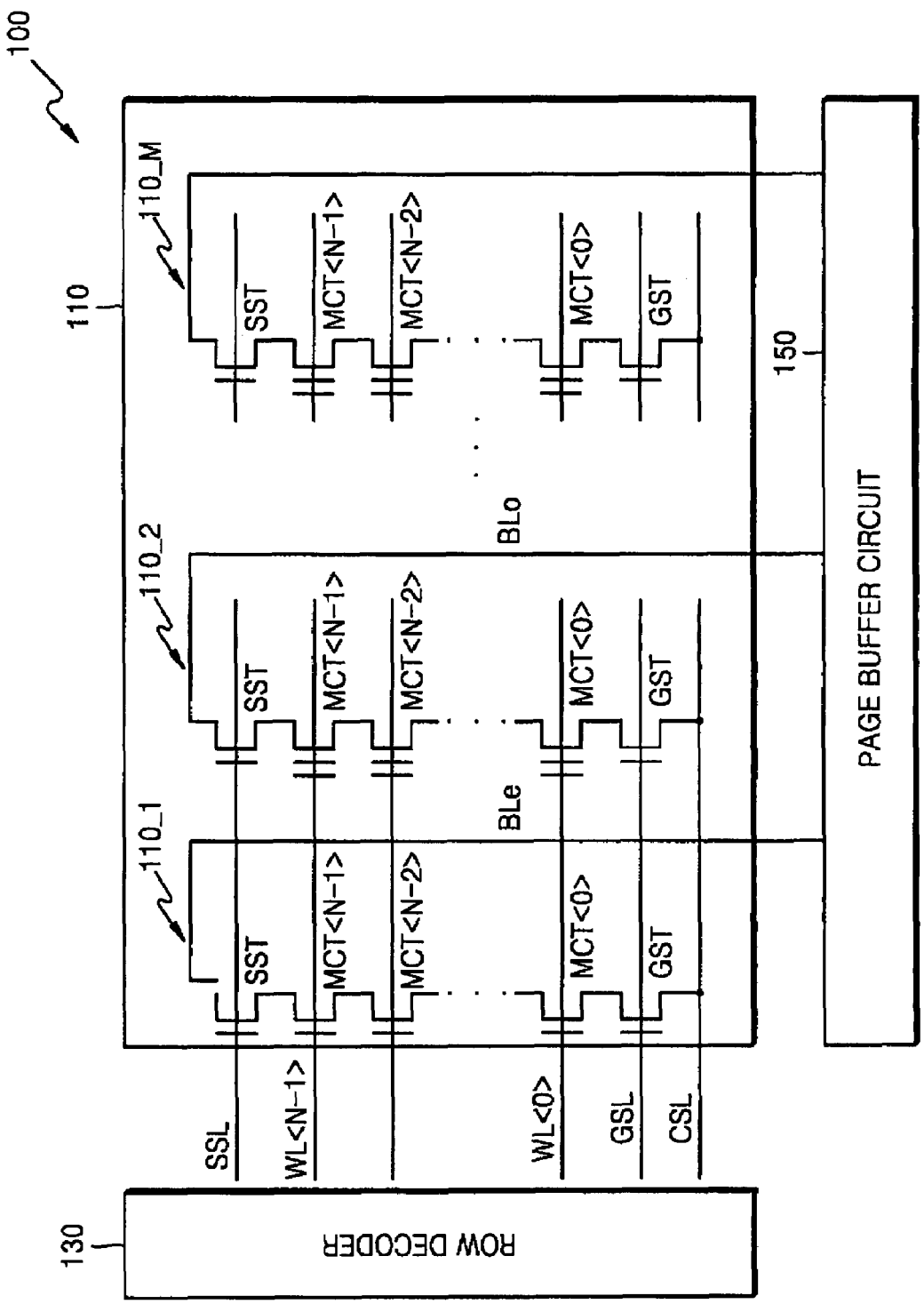
FIG. 1 is a block diagram of a non-volatile memory device.

In this disclosure, the present invention has been described with respect to An exemplary non-volatile memory device embodiment, but it will be apparent to those of ordinary skill in the art that the present invention may be variously embodied in many different types of non-volatile memory device. Throughout the written description and drawings, like reference numerals denote like or similar elements.

Figure 3:
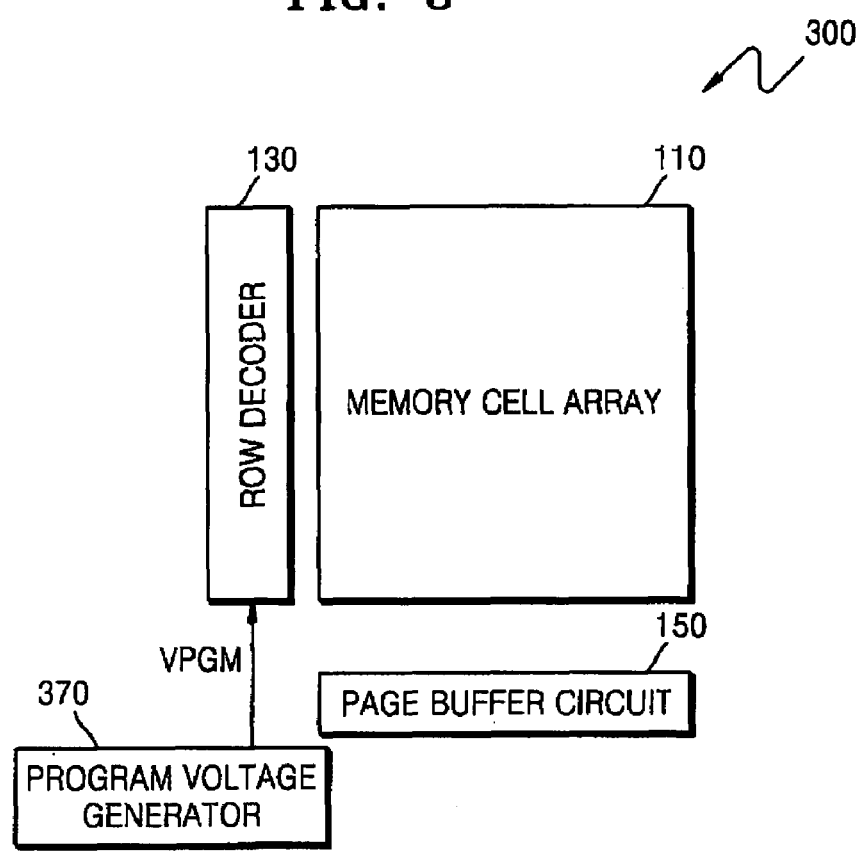
FIG. 3 is a block diagram of a non-volatile memory device according to an embodiment of the present invention.

FIG. 3 is a general block diagram of a semiconductor memory device 300, and particularly, a non-volatile semiconductor memory device according to an embodiment of the present invention. The non-volatile memory device 300 includes a memory cell array 110, a row decoder 130, a page buffer circuit 150, and a program voltage generator 370.

The construction and operation of the memory cell array 110, the row decoder 130, and the page buffer circuit 150 may be conventional in nature, as suggested by the background discussion associated with the memory cell array 110, the row decoder 130, and the page buffer circuit 150 of the non-volatile memory device 100 illustrated in FIG. 1.

The program voltage generator 370 generates a program voltage VPGM for programming a memory cell, and provides it to the row decoder 130. The row decoder 130 applies the program voltage VPGM to a word line corresponding to a memory cell that is to be programmed, thus programming the corresponding memory cell.

The program voltage generator 370 may generate the program voltage VPGM according to conventional methods well known in the field. In an embodiment of the present invention, the program voltage generator 370 generates the program voltage VPGM according to the incremental step pulse programming (ISPP) method. Hereinafter, it is assumed that the program voltage generator 370 generates the program voltage VPGM according to the ISPP method.

As described above, when program/erase operations are repeatedly performed on a non-volatile memory device, charge trapping may occur in some or all of the constituent cell transistors of the non-volatile memory device, thus causing over-programming. Therefore, according to the present invention, in order to prevent over-programming due to charge trapping, a program voltage generated according to the ISPP method is controlled in a manner that reduces the program stress applied to the cell transistor(s) in which charge trapping has occurred.

One method of controlling the program voltage according to an embodiment of the invention will now be described with reference to FIGS. 6 and 7.

Over-programming may be prevented in embodiments of the invention using a method of controlling the program voltage in accordance with a number of program/erase operations previously performed. In order to control the program voltage, an approximate number of program/erase operations may be empirically determined according to the characteristics of selected non-volatile memory device and/or related process(es) for fabricating same. For example, a particular "initial" program voltage, as applied to a particular non-volatile memory device, may allow about 100,000 program/erase operations before control should be exercised over the program voltage.

If a defined program voltage (see, e.g., FIG. 2) is applied to one memory cell not experiencing charge trapping and another cell transistor experiencing charge trapping, program stress may be induced in the cell transistor experiencing charge trapping, thereby causing over-programming. Thus, in an embodiment of the invention, over-programming may be prevented by reducing a step voltage VSTEP of a program voltage VPGM generated according to the ISPP method (see, e.g., FIG. 6), reducing a starting voltage VSTART (see FIG. 7), or reducing both the step voltage VSTEP and the starting voltage VSTART.

Figure 6:
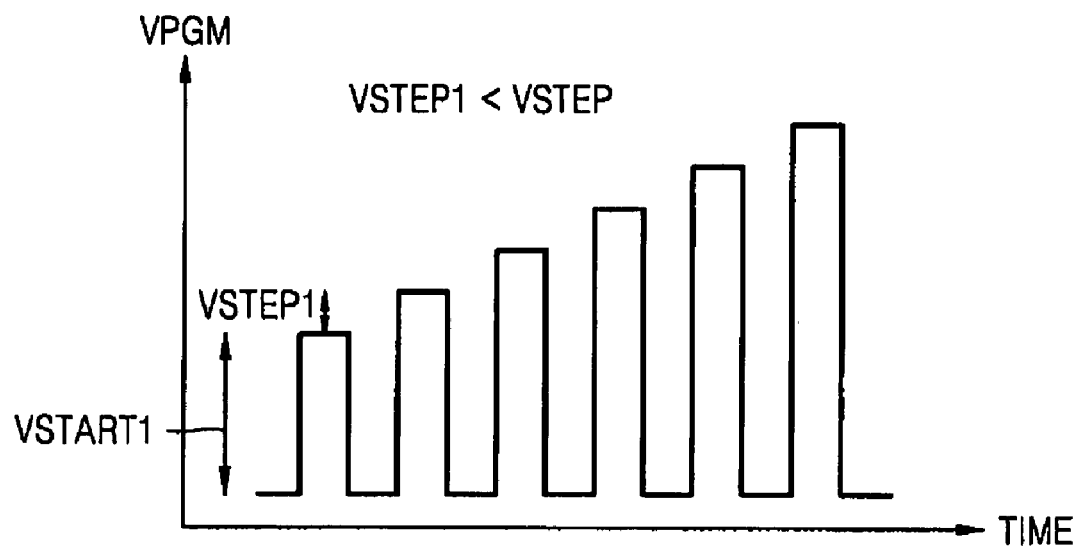
FIG. 6 is a timing diagram of a program voltage for a non-volatile memory device according to an embodiment of the present invention.

FIG. 6 is an exemplary timing diagram for a program voltage VPGM applied to a non-volatile memory device according to an embodiment of the invention. FIG. 7 is an exemplary timing diagram for a program voltage VPGM applied to a non-volatile memory device according to another embodiment of the present invention.

Figure 2:
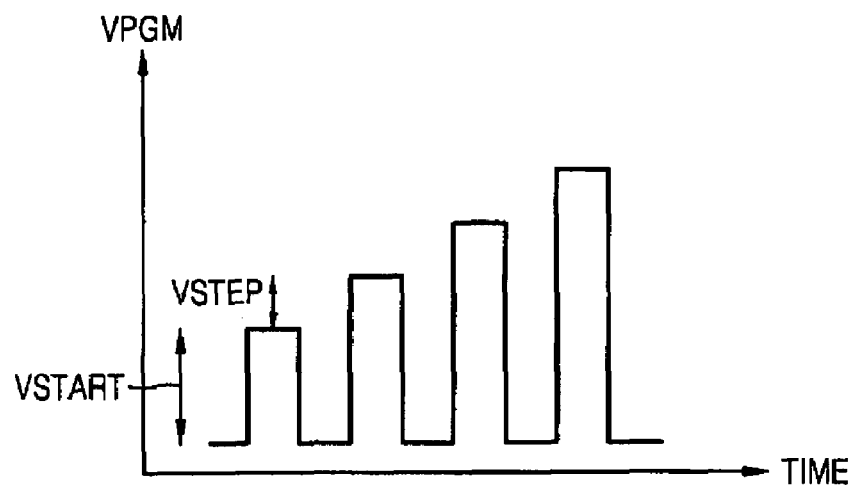
FIG. 2 is a timing diagram of a program voltage for a non-volatile memory device.

A comparison of the program voltage VPGM illustrated in FIG. 6 and the program voltage VPGM illustrated in FIG. 2 reveals that a starting voltage VSTART1 of the program voltage VPGM illustrated in FIG. 6 is equal to the starting voltage VSTART of the program voltage VPGM illustrated in FIG. 2, but a step voltage VSTEP1 of the program voltage VPGM illustrated in FIG. 6 is lower than the starting voltage VSTEP of the program voltage VPGM illustrated in FIG. 2. Thus, when the program voltage VPGM illustrated in FIG. 6 is applied to a cell transistor where charge trapping occurs, the amount of increasing voltage, i.e., the step voltage VSTEP1, is reduced, thereby minimizing program stress on the cell transistor.

Figure 7:
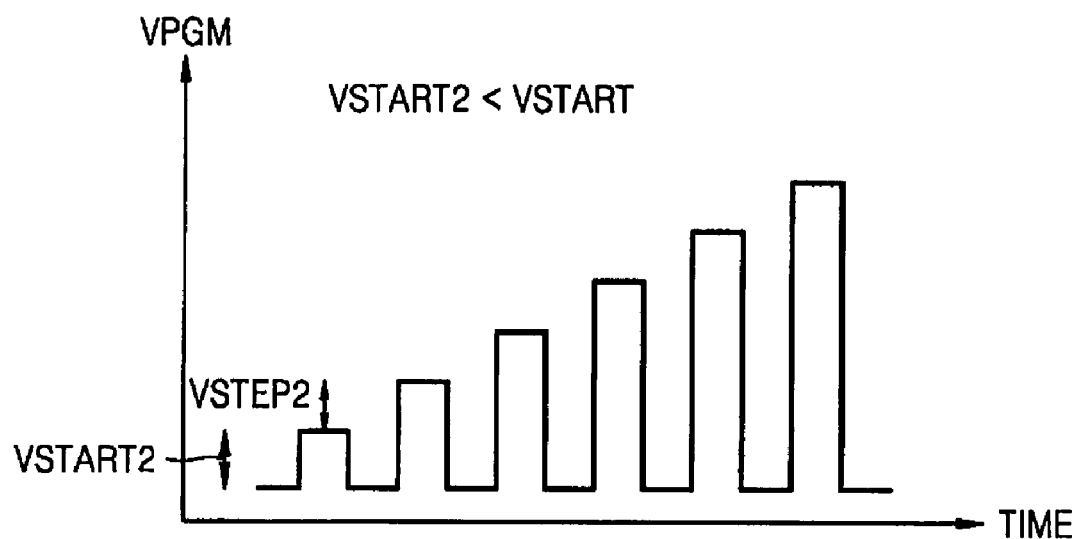
FIG. 7 is a timing diagram of a program voltage for a non-volatile memory device according to another embodiment of the present invention.

A comparison of the program voltage VPGM of FIG. 7 and the program voltage VPGM of FIG. 2 reveals that the step voltage VSTEP2 of the program voltage VPGM of FIG. 7 is equal to the step voltage VSTEP of the program voltage VPGM of FIG. 2, but the starting voltage VSTART2 of the program voltage VPGM of FIG. 7 is lower than the starting voltage VSTART of the program voltage VPGM of FIG. 2. Thus, when the program voltage VPGM of FIG. 7 is applied to a cell transistor where charge trapping occurs, an initially applied voltage, i.e., starting voltage VSTART2, is reduced, thereby minimizing program stress on the cell transistor.

It will be apparent to those of ordinary skill in the art that the embodiments of FIGS. 6 and 7 may be applied to a competent non-volatile memory device either separately or together.

Figure 4:
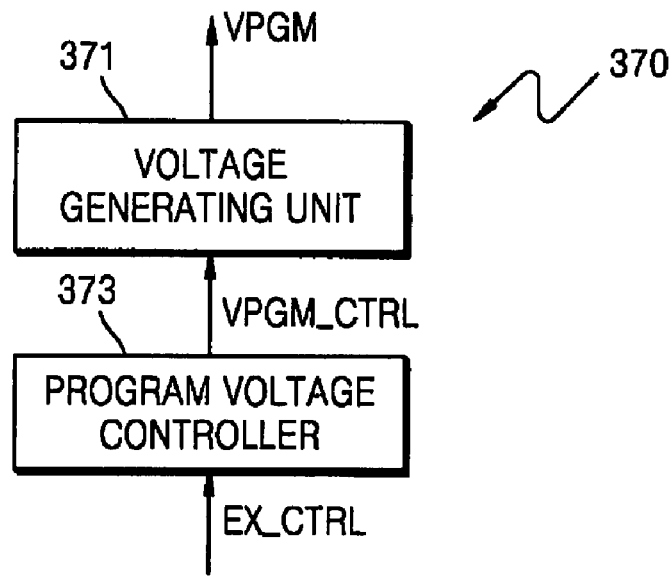
FIG. 4 is a block diagram of a program illustrated in FIG. 3, according to an embodiment of the present invention.

The construction and operation of the program voltage generator 370 will now be described in some greater detail with reference to FIGS. 4 through 7. FIG. 4 is a block diagram of the program generator 370 illustrated in FIG. 3 according to an embodiment of the invention. The program voltage generator 370 includes a program voltage controller 373 and a voltage generating unit 371.

The program voltage controller 373 generates a program voltage control signal VPGM_CTRL according to program/erase operations information EX_CTRL. In the embodiment of FIG. 4, the program/erase operations information EX_CTRL may be externally provided, and may indicate a number of times that the particular memory cell may be programmed or erased.

For example, the non-volatile memory device 300 of FIG. 3 may be used as a storage device of a multimedia system, and a processor of the multimedia system is capable of monitoring the program/erase operations information (a number of times that program/erase is performed) for a non-volatile memory device. When the number of times that program/erase is performed is equal to or greater than a predetermined number of times, the processor transmits the program/erase operations information EX_CTRL indicating this fact to the program voltage controller 373, and the program voltage controller 373 generates a program voltage control signal VPGM_CTRL according to the program/erase operations information EX_CTRL.

The program voltage control signal VPGM_CTRL controls a starting voltage VSTART and/or a step voltage STEP of a program voltage VPGM. In an embodiment of the present invention, over-programming is prevented by reducing the step voltage VSTEP (see FIG. 6), the starting voltage VSTART (see FIG. 7), or both the step voltage VSTEP and the starting voltage VSTART.

Accordingly, it is possible to reduce the starting voltage VSTART and/or the step voltage VSTEP by using the program voltage control signal VPGM_CTRL. The voltage generating unit 371 generates a program voltage VPGM, the starting voltage VSTART and/or the step voltage VSTEP of which is reduced, in response to the program voltage control signal VPGM_CTRL.

Figure 5:
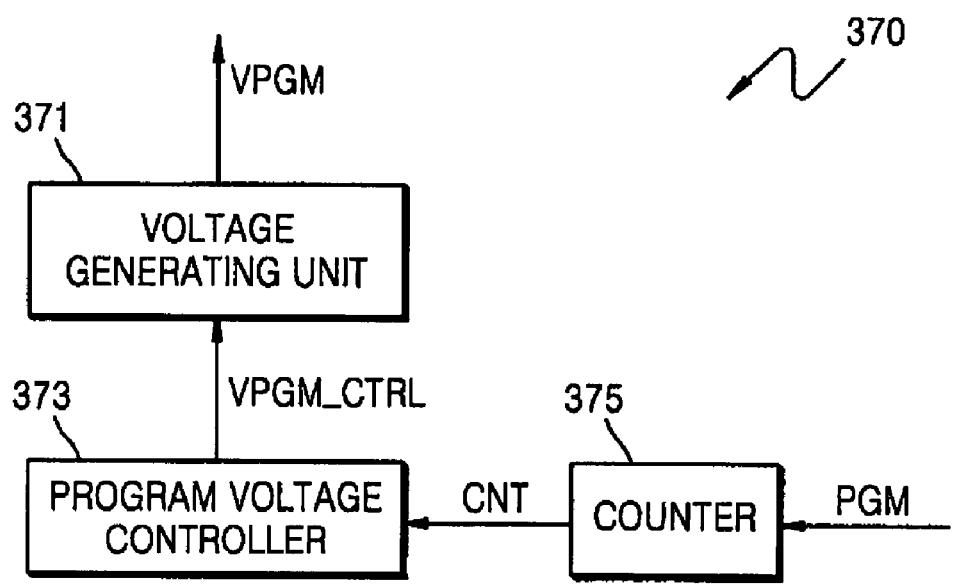
FIG. 5 is a block diagram of a program illustrated in FIG. 3, according to another embodiment of the present invention.

FIG. 5 is a block diagram of the program generator 370 illustrated in FIG. 3 according to another embodiment of the present invention. As compared to the program generator 370 illustrated in FIG. 4, the program voltage generator 370 of FIG. 5 further includes a counter 375. As described above with reference to FIG. 4, program/erase operations information may indicate a number of times that a particular memory cell may be programmed or erased.

In the embodiment illustrated in FIG. 5, the counter 375 counts the number of times that a memory cell is programmed or erased, and a program voltage controller 373 generates a program voltage control signal VPGM_CTRL in response to the result of counting of the counter 375. For example, on an assumption that an external processor gives a command that instructs a non-volatile memory device to be programmed, the counter 375 counts a number of times that such a command is received from the external processor. The program voltage controller 373 determines whether the result of counting of the counter 375 is equal to a predetermined number of times that programming can be performed, and generates a program voltage control signal VPGM_CTRL based on the result of determination.

According to embodiments of the invention, a program voltage may be controlled in accordance with the number of program/erase operations applied to a non-volatile memory cell. However, in general, memory cell blocks of a non-volatile memory device are alternately and sequentially programmed, and each of the memory cell blocks is programmed in units of strings. Accordingly, the program/erase operations information for memory cell may be the same as that for all memory cells.

As described above, according to an embodiment of the present invention, a non-volatile memory device can be programmed without causing over-programming even if charge trapping occurs therein, thereby improving the reliability of semiconductor memory device.

Also, according to an embodiment of the present invention, even if program/erase is performed in a non-volatile memory device a predetermined number of times that program/erase can be performed, it is possible to reliably program the non-volatile memory device by controlling a program voltage, thereby increasing the lifetime of the non-volatile memory device.

While this invention has been particularly shown and described with reference to exemplary embodiments thereof, it will be understood by those skilled in the art that various changes in form and details may be made therein without departing from the scope of the invention as defined by the appended claims.

What is claimed is:

1. A circuit generating a program voltage in a non-volatile memory device, the circuit comprising:
a program voltage controller generating a program voltage control signal in accordance with program/erase operations information, wherein the program/erase operations information indicates a number of times that a memory cell in the non-volatile memory device has been programmed or erased; and
a voltage generating unit generating the program voltage, wherein the program voltage has a level that varies in response to the program voltage control signal.

2. The circuit of claim 1, wherein the voltage generating unit generates the program voltage using an incremental step pulse programming method.

3. The circuit of claim 2, wherein the program voltage control signal controls at least one of a starting voltage and a step voltage defining the program voltage.

4. The circuit of claim 3, wherein the voltage controller reduces at least one of the starting voltage and step voltage in response to the program voltage control signal.

5. The circuit of claim 1, wherein the program/erase operations information is externally provided.

6. The circuit of claim 1, further comprising a counter counting the number of times, and generating the program/erase operations information as a result of the counting.

7. A non-volatile semiconductor memory device comprising:
a circuit generating a program voltage in a non-volatile memory device, wherein the circuit comprises:
a program voltage controller generating a program voltage control signal in accordance with program/erase operations information, wherein the program/erase operations information indicates a number of times a memory cell in the non-volatile memory device has been programmed or erased; and
a voltage generating unit generating the program voltage, wherein the program voltage has a level that varies in response to the program voltage control signal.

8. A method of generating a program voltage for programming a memory cell in a non-volatile memory device, the method comprising:
generating a program voltage control signal in accordance with program/erase operations information indicating a number of times a memory cell in the non-volatile memory device has been programmed or erased; and
generating the program voltage having a level that varies in response to the program voltage control signal.

9. The method of claim 8, wherein the program voltage is generated using an incremental step pulse programming method.

10. The method of claim 9, wherein the program voltage control signal controls at least one of a starting voltage and a step voltage defining the program voltage.

11. The method of claim 10, wherein the at least one starting voltage and step voltage is reduced in response to the program voltage control signal.

12. The method of claim 8, wherein the program/erase operations information is externally provided.

13. The method of claim 8, further comprising:
counting the number of times that the memory cell has been programmed or erased, and generating the program/erase operations information in relation to the counting.

14. A programming method for a non-volatile memory device, comprising:
generating a program voltage control signal in accordance with program/erase operations information indicating a number of times a memory cell in the non-volatile memory device has been programmed or erased;
generating a program voltage having a level that varies in response to the program voltage control signal; and
applying the program voltage to a memory cell in the non-volatile memory device.

15. The programming method of claim 14, wherein the program voltage is generated using an incremental step pulse programming method.

* * * * *